(12) United States Patent
Lai

(10) Patent No.: US 8,164,108 B2
(45) Date of Patent: Apr. 24, 2012

(54) LIGHT EMITTING DIODE CHIP AND MANUFACTURING METHOD THEREOF

(75) Inventor: Chih-Chen Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 140 days.

(21) Appl. No.: 12/764,109

(22) Filed: Apr. 21, 2010

(65) Prior Publication Data

US 2011/0233584 A1  Sep. 29, 2011

(30) Foreign Application Priority Data

Mar. 24, 2010  (TW) ................................ 99108716 A

(51) Int. Cl.
 *H01L 33/00* (2010.01)
 *H01L 21/00* (2006.01)
(52) U.S. Cl. .................... 257/98; 257/95; 257/E33.068; 438/29; 438/39; 438/46
(58) Field of Classification Search ............. 257/98, 257/91, 95, 99, E33.068; 438/29, 39.46
 See application file for complete search history.

(56) References Cited

U.S. PATENT DOCUMENTS

2009/0092165 A1 * 4/2009 Sakai ..................... 372/46.01

* cited by examiner

*Primary Examiner* — A. Sefer
*Assistant Examiner* — Nikolay Yushin
(74) *Attorney, Agent, or Firm* — Altis Law Group, Inc.

(57) ABSTRACT

A light emitting diode chip includes a thermal conductive substrate, an epi-layer, a thin-type ohmic contacting film, a transparent conducting layer, and an electrode pad. The epi-layer includes a p-type semiconductor layer, an n-type semiconductor layer, and an active layer. The n-type semiconductor layer includes a stepped surface at a side thereof facing away from the substrate, and the stepped surface includes a central portion and a peripheral portion surrounding the central portion. The n-type semiconductor layer has a thickness decreasing along directions from a center thereof to opposite lateral peripheries thereof. The ohmic contacting film is arranged on the stepped surface. The conducting layer is arranged on the ohmic contacting film. The electrode pad is arranged on the conducting layer and located corresponding to the central portion of the stepped surface.

16 Claims, 12 Drawing Sheets

LIGHT EMITTING DIODE CHIP AND MANUFACTURING METHOD THEREOF

1. TECHNICAL FIELD

The disclosure generally relates to light emitting diode (LED) chips, and particularly to an LED chip with high luminous efficiency and a method for making the LED chip.

2. DESCRIPTION OF RELATED ART

In recent years, due to excellent light quality and high luminous efficiency, light emitting diodes (LEDs) have increasingly been used to substitute for cold cathode fluorescent lamps (CCFL) as a light source of an illumination device.

An LED chip is an essential part of a single LED for emitting light. A typical LED chip generally includes a p-type semiconductor layer, an n-type semiconductor layer, and an active layer. The active layer is coupled between the p-type semiconductor layer and the n-type semiconductor layer. When a voltage is applied to the p-type semiconductor layer and the n-type semiconductor layer, electrons can recombine with holes within the active layer, releasing energy in the form of photons.

Currently, one challenge the LED industry faces is how to enhance luminous efficiency of the LEDs. Generally, when an electric current applied to a single LED chip can be spread uniformly, the LED chip emits light efficiently. However, electric current spreading uniformly in the LED chips is difficult to be achieved and thus results in inferior quality LED.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the LED chips and the method for manufacturing a single LED chip will now be described in detail below and with reference to the drawings.

Figure 1:
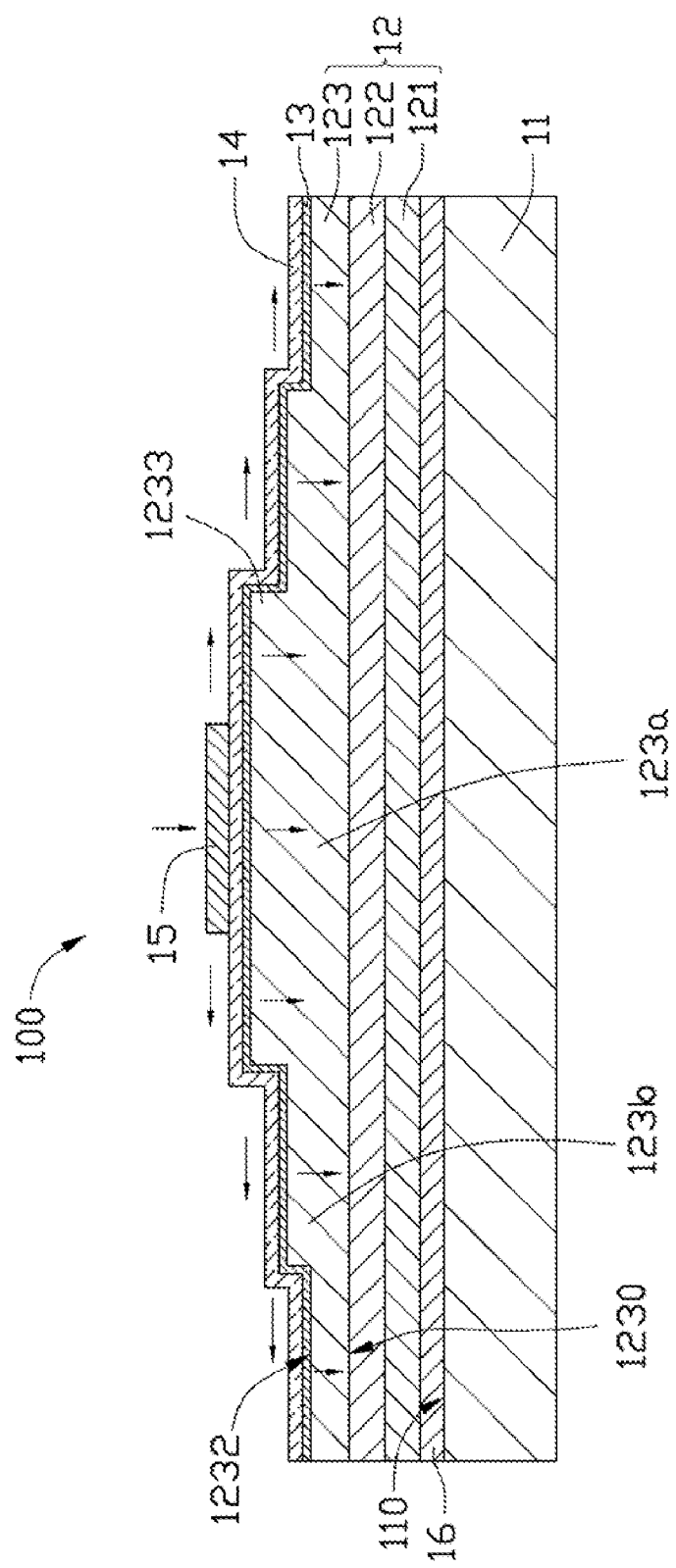
FIG. 1 is cross-section of an LED chip, in accordance with a first embodiment.
Figure 2:
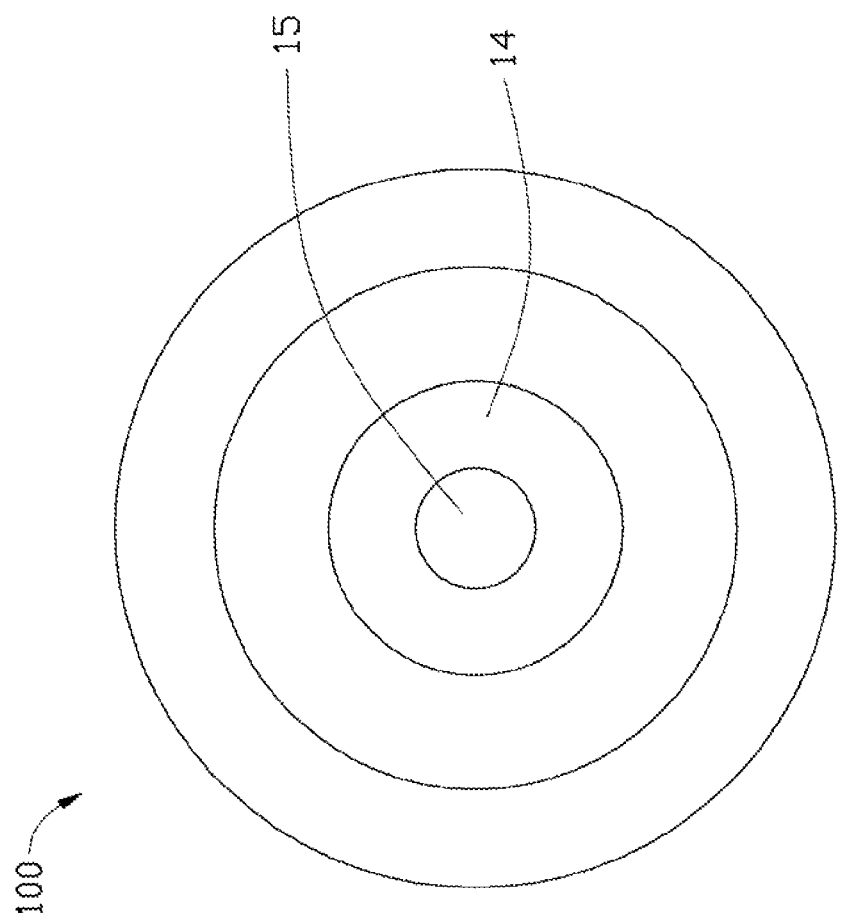
FIG. 2 is top plan view of the LED chip of FIG. 1.

Referring to FIG. 1, an LED chip 100 in accordance with a first embodiment is shown. The LED chip 100 includes a thermal conductive substrate 11, an epi-layer 12, a thin-type ohmic contacting film 13, a transparent conducting layer 14, and an electrode pad 15. Referring also to FIG. 2, in this embodiment, the LED chip 100 has a generally cylindrical shape. In alternative embodiments, the LED chip 100 may have a cuboid shape.

The substrate 11 can be made of metal with high thermal conductivity, such as aluminum, copper, nickel, silver, gold, an alloy thereof, or another suitable metal or alloy. In this embodiment, the substrate 11 is made of nickel. The substrate 11 has a generally cylindrical shape or a general disk shape, and includes a circular plane surface 110. The epi-layer 12, the ohmic contacting film 13, the conducting layer 14, and the electrode pad 15 are arranged in sequence on the substrate 11 along a direction perpendicular to the plane surface 110. The epi-layer 12 is near the substrate 11. The electrode pad 15 is farther from the substrate 11.

The epi-layer 12 includes a p-type semiconductor layer 121, an active layer 122, and an n-type semiconductor layer 123. The p-type semiconductor layer 121 contacts the plane surface 110. The n-type semiconductor layer 123 is farther from the plane surface 110. The active layer 122 is sandwiched between the p-type semiconductor layer 121 and the n-type semiconductor layer 123. The epi-layer 12 may be essentially made of AlGaN or InGaN, or another suitable semiconductor material. In this embodiment, the epi-layer 12 is essentially made of GaN. The n-type semiconductor layer 123 has a first surface 1230 and a second surface 1232 at two opposite sides thereof. The first surface 1230 is a plane surface contacting the active layer 122. The second surface 1232 is a stepped surface 1232 facing away from the active layer 122. The n-type semiconductor layer 123 includes a number of, for example three coaxial steps 1233 arranged in sequence along a direction perpendicular to the first surface 1230. Each step 1233 has a generally cylindrical shape, or a general disk shape. The step 1233 farther from the active layer 122 has a size greater than a neighboring step 1233 near the active layer 122. In a direction parallel to the first surface 1230, the n-type semiconductor layer 123 includes a central section 123a and a peripheral section 123b surrounding the central section 123a. A thickness of the n-type semiconductor layer 123 has a step-like distribution. The step-like distribution is formed as the thickness in the direction from the central section 123a to the peripheral section 123b decreases. It is understood, the central section 123a has a relatively greater thickness than the peripheral section 123b. Accordingly, the central section 123a has a relatively greater resistance than the peripheral section 123b.

The ohmic contacting film 13 is formed on the entire second surface 1232. The conducting layer 14 is formed on a side of the ohmic contacting film 13 facing away from the epi-layer 12. Each of the ohmic contacting film 13 and the conducting layer 14 has a uniform thickness and a step-like distribution. The conducting layer 14 can be made of indium tin oxide (ITO) or indium zinc oxide (IZO). The ohmic contacting film 13 can be made of metallic material with good electrical conductive property, such as titanium. The ohmic contacting film 13 is configured to provide good ohmic contact between the conducting layer 14 and the n-type semiconductor layer 123; thus, electric current can flow through between the conducting layer 14 and the n-type semiconductor layer 123 easily.

The electrode pad 15 is formed on the conducting layer 14 (see FIG. 2) and faces the central section 123a of the n-type semiconductor layer 123. The electrode pad 15 can be made of metal with high thermal conductivity, such as aluminum, copper, silver, an alloy thereof, or another suitable metal or alloy. In this embodiment, the electrode pad 15 is made of gold.

In operation, the substrate 11 and the electrode pad 15 each are electrically connected to an exterior power supply (not shown). In particular, the substrate 11 is connected to a positive electrode of the exterior power supply, and the electrode pad 15 is connected to a negative electrode of the exterior power supply. Thereby, electric current can be applied to the epi-layer 12. Electrons from the n-type semiconductor layer 123 can recombine with holes from the P-type semiconductor layer 121 in the active layer 122, releasing energy in the form of photons, and thus emitting light.

One advantage of the LED chip 100 is that the LED chip 100 can emit light efficiently for the electric current can be distributed uniformly in the active layer 122, as shown in arrows of FIG. 1. The uniform distribution of the electric current is achieved by spreading the electric current flowing in the n-type semiconductor layer 123 from the central section 123a with relatively higher resistance to the peripheral section 123b with relatively lower resistance. Another advantage yielded by the LED chip 100 is that the substrate 11 made of metal can be mounted to another heat dissipating device (not shown), such as a heat sink. Thus heat generated by the epi-layer 12 can be transferred to the heat sink through the substrate 11. The heat sink then dissipates heat to an ambient environment. In this manner, the LED chip 100 may operate continually within an acceptable temperature range to achieve stable optical performance, and the brightness and the luminous efficiency of the LED chip 100 are stably maintained.

The LED chip 100 may further include a reflective layer 16 coupled between the substrate 11 and the p-type semiconductor layer 121. The reflective layer 16 is configured to prevent the light from being absorbed by the substrate 11. In operation, the reflective layer 16 reflects light to the ambient environment through the first surface 1230; thus, luminous efficiency of the LED chip 100 is further increased. The reflective layer 16 can be a distributed Bragg reflector (DBR) made of material such as AlGaAs or AlAs. Alternatively, the reflective layer 16 can be a metal reflector made of material such as aluminum, copper, nickel, silver, gold, or an alloy thereof.

Figure 3:
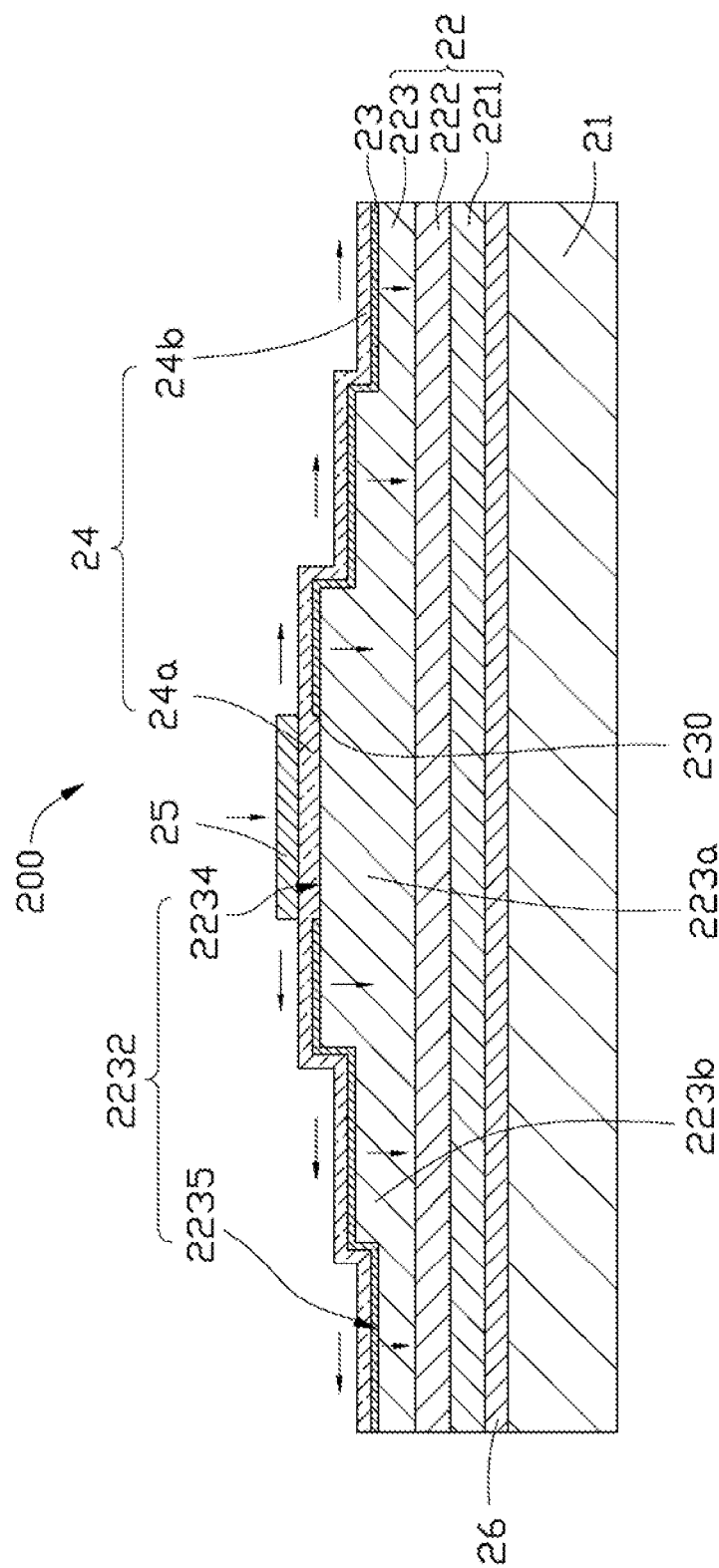
FIG. 3 is cross-section of an LED chip, in accordance with a second embodiment.

Referring to FIG. 3, an LED chip 200, in accordance with a second embodiment, is shown. The LED 200 is similar to the LED 100 in the first embodiment and includes a thermal conductive substrate 21, an epi-layer 22, a thin-type ohmic contacting film 23, a transparent conducting layer 24, an electrode pad 25, and a reflective layer 26. The epi-layer 12 includes a p-type semiconductor layer 221, an active layer 222, and an n-type semiconductor layer 223. The n-type semiconductor layer 223 includes a central section 223a and a peripheral section 223b surrounding the central section 223a. Accordingly, a second surface 2232 of the n-type semiconductor layer 223 includes a central portion 2234 and a peripheral portion 2235 surrounding the central portion 2234. The central portion 223a is located at the central portion 2234, and the peripheral portion 223b is located at the peripheral portion 2235. However, for the LED chip 200, the ohmic contacting film 23 is not necessary to form on an entire second surface 2232 of the n-type semiconductor layer 223. The ohmic contacting film 23 is annular with a hole 230 defined therein for exposing the central portion 2234 of the second surface 2232 to the conducting layer 24. Accordingly, the conducting layer 24 includes a portion 24a filling in the hole 230 and covering the central portion 2234, and another portion 24b formed on the ohmic contacting film 23.

The portion 24a of the conducting layer 24 covering the central portion 223a of the second surface 2232 is configured to provide non-ohmic contact between the conducting layer 24 and the n-type semiconductor layer 223. Thus, electric current may not flow through the central portion 2234 of the second surface 2232 to the central section 223a of the n-type semiconductor layer 223, as shown in arrows of FIG. 3. Accordingly, the central section 223a of the n-type semiconductor layer 223 may not emit light from the central portion 2234 of the second surface 2232 to the electrode pad 25. The lost of the light being blocked by the electrode pad 25, which generally is not light-pervious, is avoided. In this embodiment, only the peripheral section 223b of the n-type semiconductor layer 223 emit light from the peripheral portion 2235 of the second surface 2232 to an ambient environment. The LED chip 200 emits light in an efficient manner.

Figure 4:
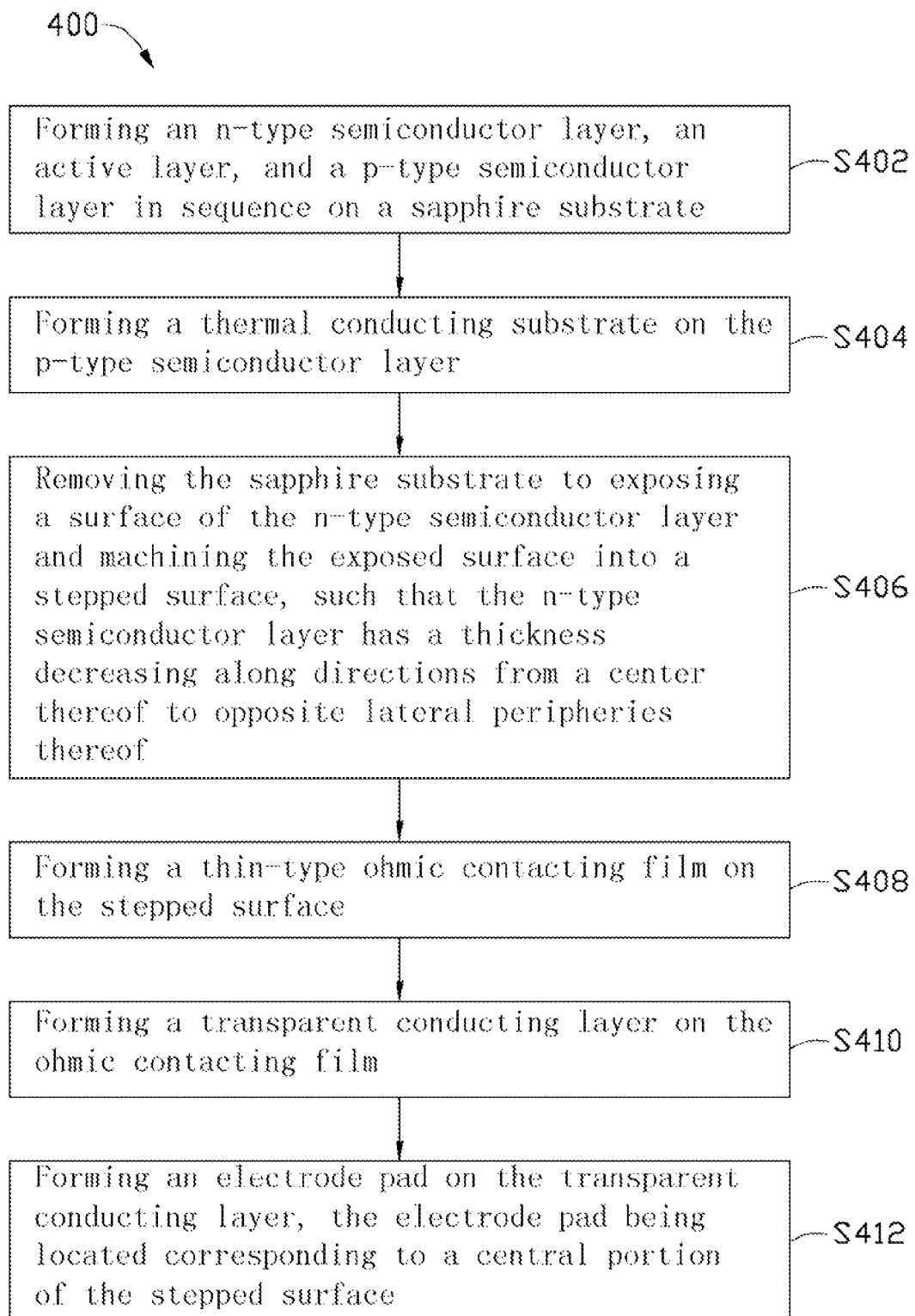
FIG. 4 is a flow chart of a method for manufacturing the LED chip of FIG. 3.

Referring to FIG. 4, the disclosure also relates to a method 400 for manufacturing the LED chip 200 in the second embodiment. Referring also to FIGS. 5 to 12, the method 400 is summarized in detail below.

Figure 5:
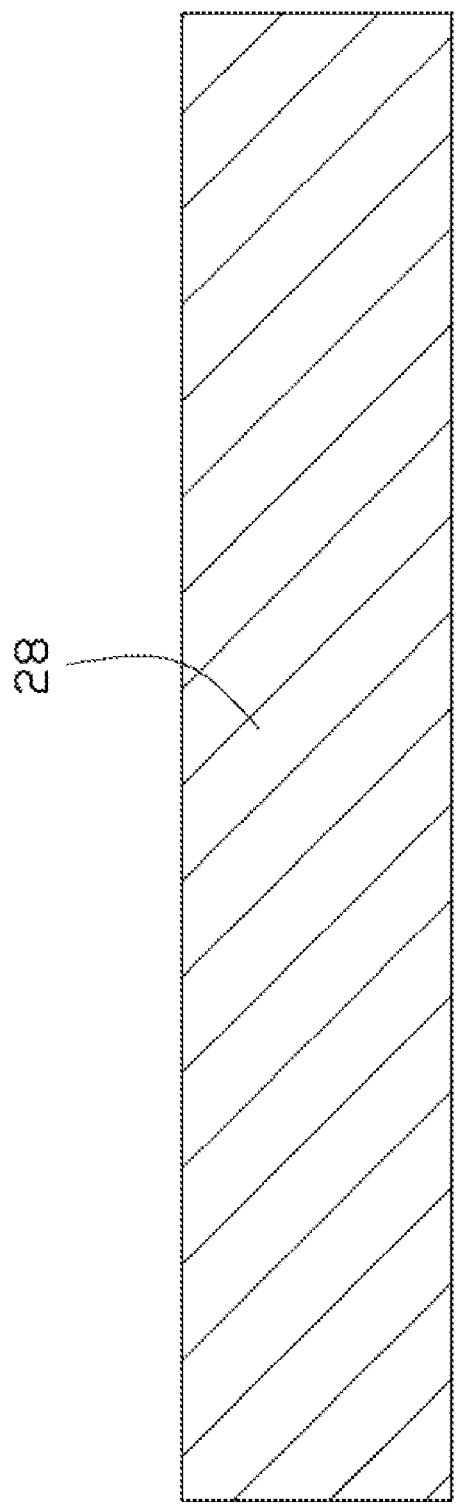
FIG. 5 is cross-section of a sapphire substrate used in the method of FIG. 4.
Figure 6:
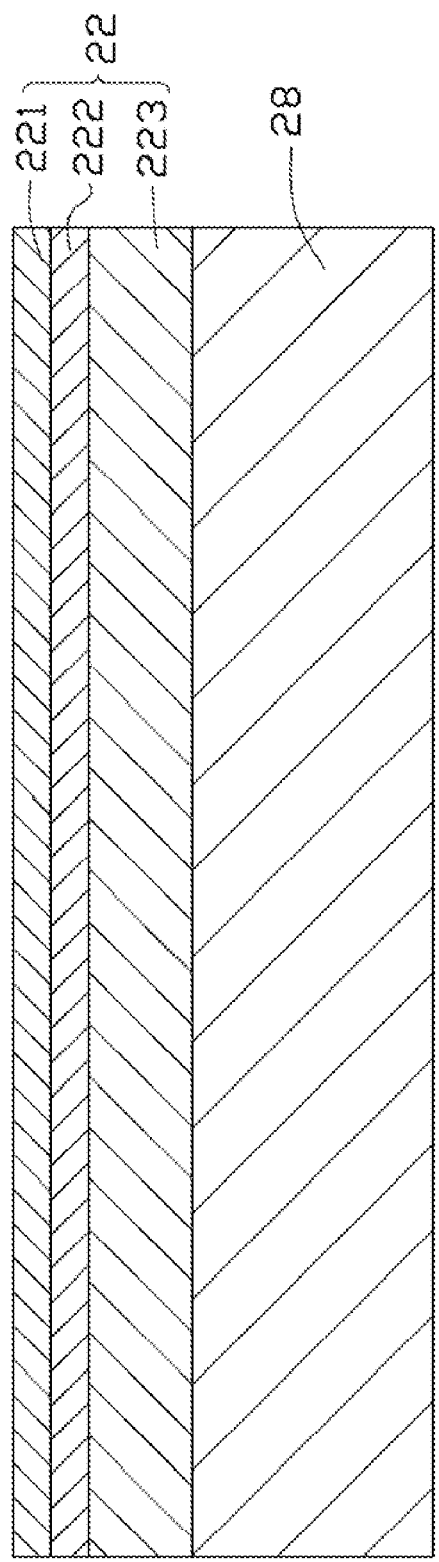
FIG. 6 is similar to FIG. 5, but showing an epi-layer is formed on the sapphire substrate, the epi-layer including a p-type semiconductor layer and an n-type semiconductor layer.

In step 402, a substrate 28 as shown in FIG. 5 is provided and an n-type semiconductor layer 223, an active layer 222, and a p-type semiconductor layer 221 are formed in sequence on the substrate 28 (see FIG. 6). The substrate 28 can be a sapphire substrate 28. The n-type semiconductor layer 223, the active layer 222, and the p-type semiconductor layer 221 each are part of the epi-layer 22. The n-type semiconductor layer 223 may have a thickness in a range from about 2 μm to about 3 μm. In this embodiment, the thickness of the n-type semiconductor layer 223 is about 3 μm.

In step 404, a thermal conductive substrate 11 is provided and formed on the p-type semiconductor layer 221. In this embodiment, before the thermal conductive substrate 11 is formed on the p-type semiconductor layer 221, a reflective layer 26 is formed on the p-type semiconductor layer 221. Such that the reflective layer 26 is coupled between the p-type semiconductor layer 221 and the thermal conducting substrate 21 when the thermal conducting substrate 21 is formed on the p-type semiconductor layer 221. In this embodiment, a material of the reflective layer 26 can be silver, and the reflective layer 26 can be formed on the p-type semiconductor layer 221 by applying electron beam deposition, sputtering, vacuum evaporation, or electroplating. The thermal conducting substrate 21 can be formed on the reflective layer 26 by applying electroplating, using nickel as a base material.

Figure 7:
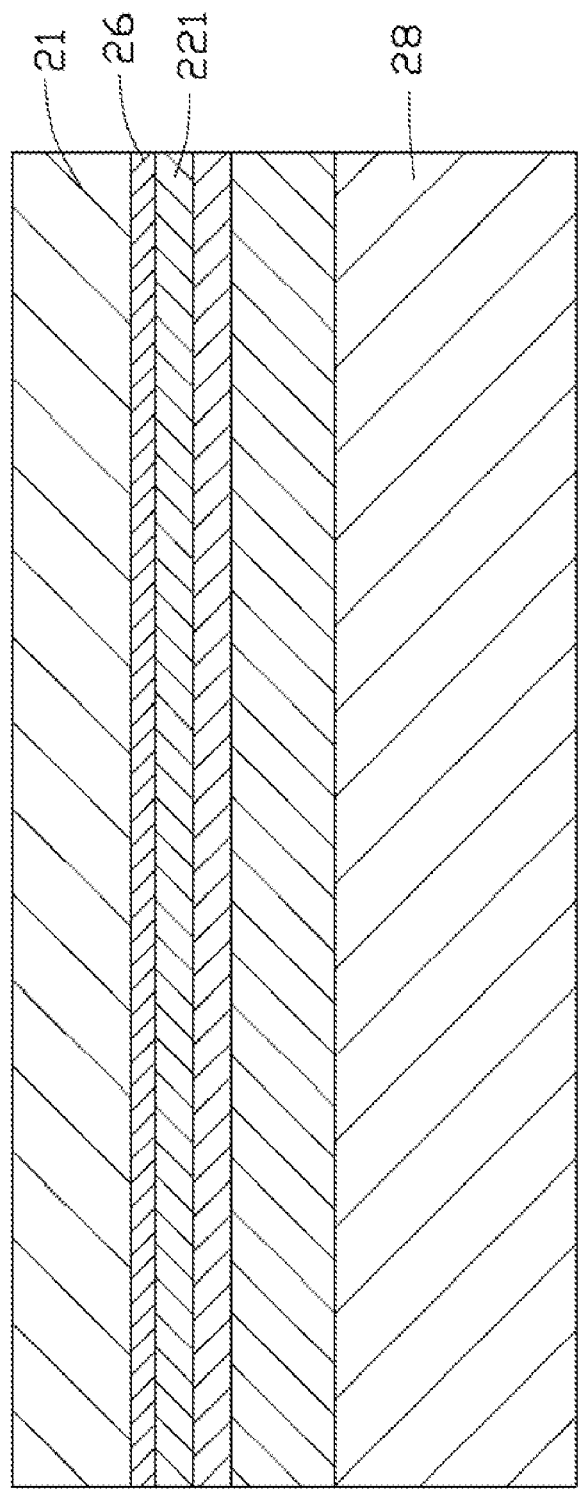
FIG. 7 is similar to FIG. 6, but showing a reflective layer and a thermal conductive substrate are formed on the p-type semiconductor layer in sequence.
Figure 8:
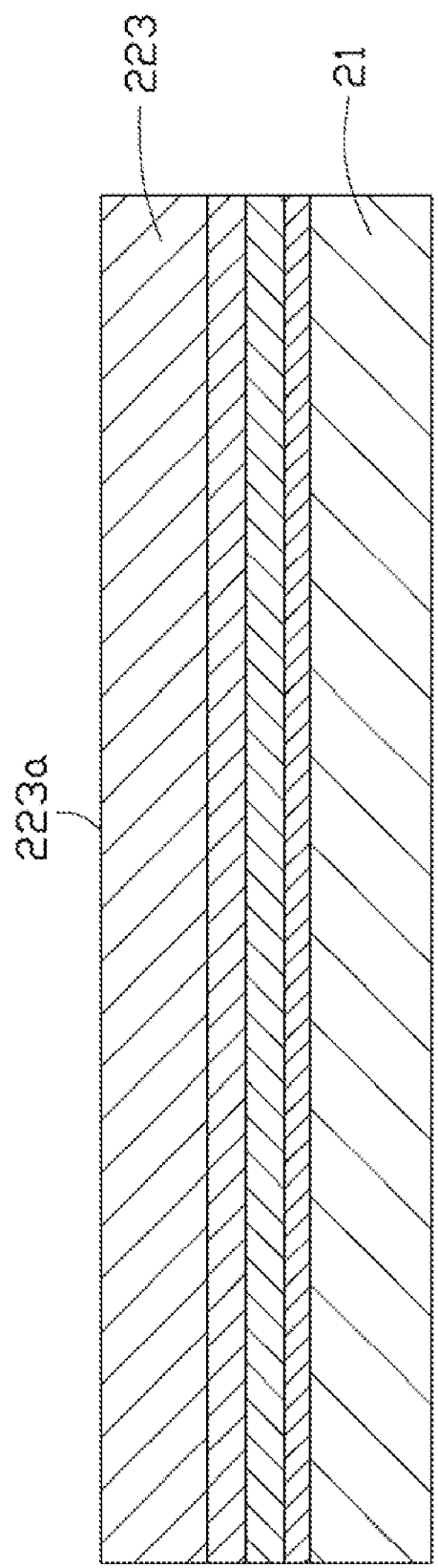
FIG. 8 is similar to FIG. 7, but showing the thermal conductive substrate, the reflective layer and the epi-layer after the sapphire substrate has been removed from the epi-layer to expose a surface of the n-type semiconductor layer.
Figure 9:
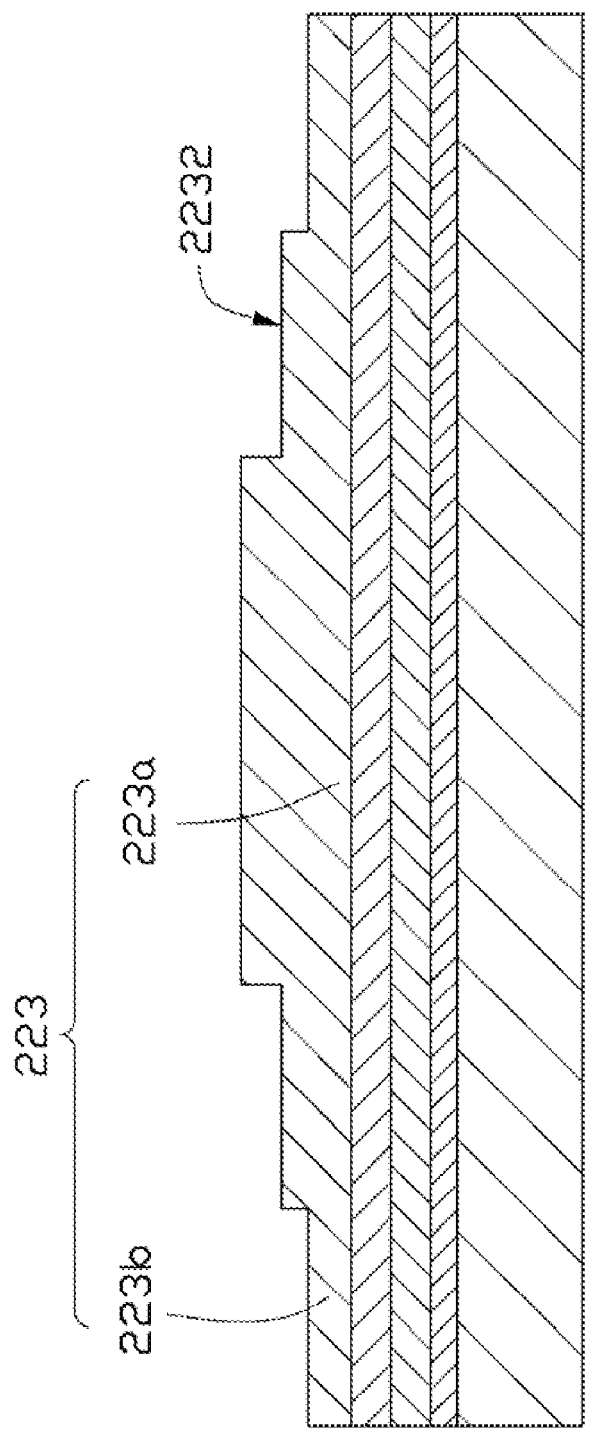
FIG. 9 is similar to FIG. 8, but showing the exposed surface of the n-type semiconductor layer is machined into a stepped surface.

Referring to FIGS. 7-9, in step 406, the sapphire substrate 28 is removed from the n-type semiconductor layer 223 to expose a surface 223a of the n-type semiconductor layer 223 (see FIG. 8), and the surface 223a of the n-type semiconductor layer 223 is machined to form a stepped surface 2232 (see FIG. 9). The sapphire substrate 28 can be removed by applying mechanical cutting method such as grinding. Alternatively, the sapphire substrate 28 can be removed by applying electromagnetic radiation. In this embodiment, the sapphire substrate 28 can be removed by using laser cutting method. As shown in FIG. 8, when the sapphire substrate 28 has been removed, the surface 223a of the n-type semiconductor layer 223 facing away from the substrate 21 is exposed.

Referring also to FIG. 9, the exposed surface 223a can be machined into the stepped surface 2232 by applying a photolithography. In one typical example, a photo resist film (not shown) is firstly coated on the surface 223a of the n-type semiconductor layer 223 and exposed to ultraviolet (UV) light. The surface 223a then can be etched to form the stepped surface 2232 by using inductive couple plasma. It can be understood that the photolithography can be applied on the surface 223a for several times until the stepped surface 2232 is finally formed. Generally, a thinnest portion of the n-type semiconductor layer 223 is greater or equal to 50% of a thickest portion of the n-type semiconductor layer 223; thus, the n-type semiconductor layer 223 can emit light even in the thinnest portion. In this embodiment, a thickest portion of the n-type semiconductor layer 223 is located in the central section 223a, and the central portion 223a has a thickness of 3 μm. In contrast, the thinnest portion of the n-type semiconductor layer 223 is located in the peripheral portion 223b, and the thinnest portion of the n-type semiconductor layer 223 is about 1.5 μm.

Figure 10:
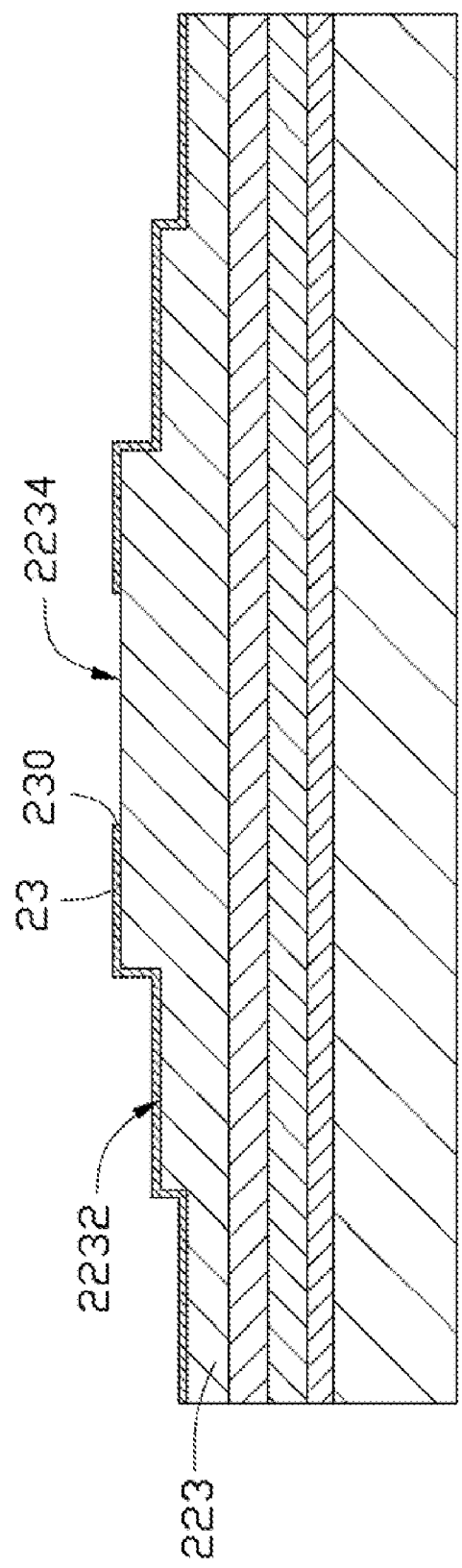
FIG. 10 is similar to FIG. 9, but showing an ohmic contacting film is formed on the stepped surface.

Referring also to FIG. 10, in step 408, a thin-type ohmic contacting film 23 is formed on the stepped surface 2232. In this embodiment, the ohmic contacting film 23 is formed on the entire stepped surface 2232 by using deposition method, such as electron beam deposition, sputtering, vacuum evaporation, or electroplating. Then the ohmic contacting film 23 covering a central portion 2234 of the stepped surface 2232 is removed by using photolithography. Thus a hole 230 is defined in the ohmic contacting film 23 and the central portion 2234 is exposed.

Figure 11:
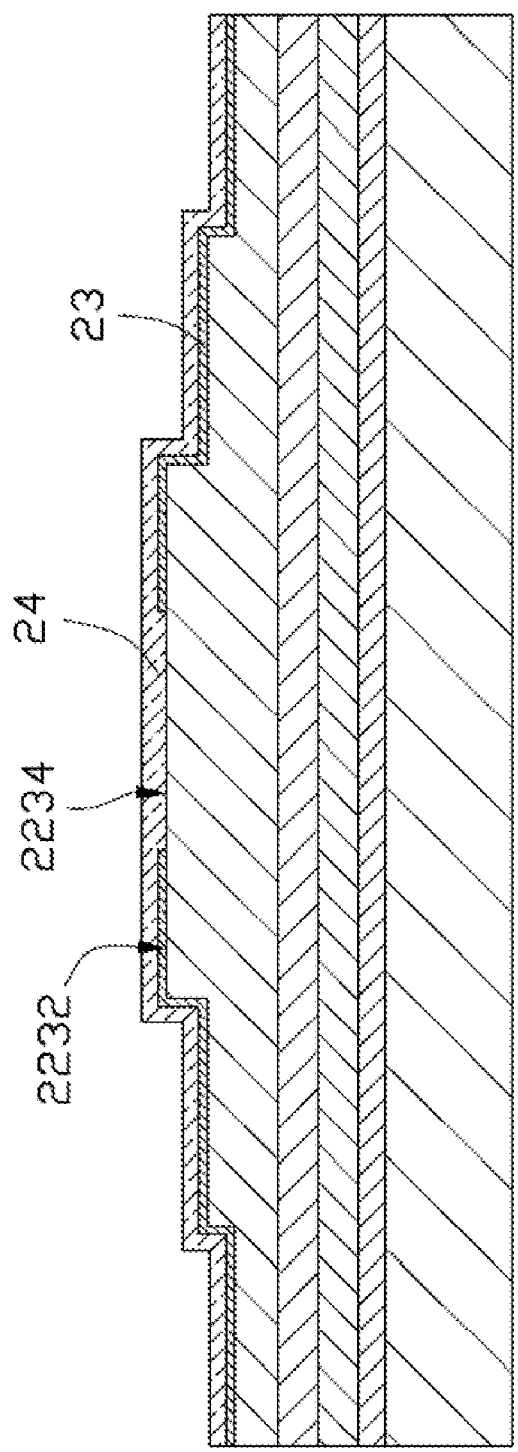
FIG. 11 is similar to FIG. 10, but showing a transparent conducting layer is formed on the ohmic contacting film.

Referring also to FIG. 11, in step 410, a transparent conducting layer 24 is formed on the stepped surface 2232. The conducting layer 24 covers the ohmic contacting film 23 and the central portion 2234 of the stepped surface 2232. In this embodiment, the conducting layer 24 is made of indium zinc oxide, and the conducting layer 24 is formed by applying sputtering.

Figure 12:
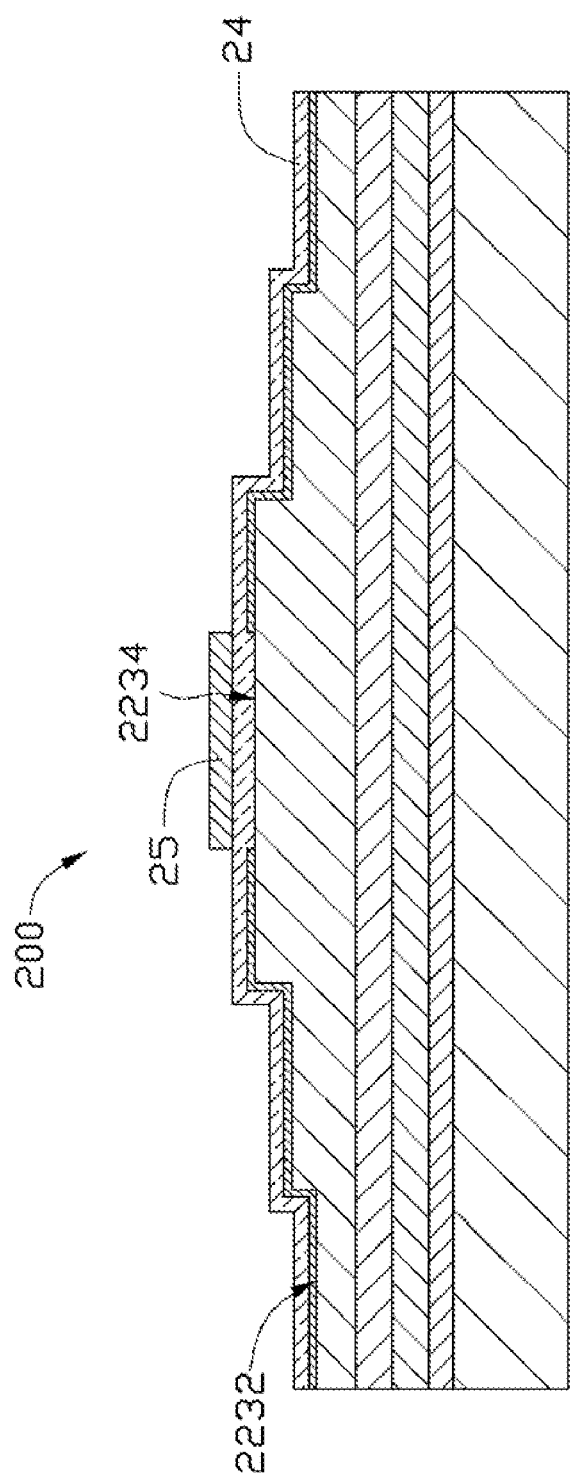
FIG. 12 is similar to FIG. 11, but showing an electrode pad is formed on the ohmic contacting film.

Referring also to FIG. 12, in step 412, an electrode pad 25 is formed on the conducting layer 24. In this embodiment, the electrode pad 25 is made of gold, and the electrode pad 25 is firstly formed to cover the entire conducting layer 24 by using plasma enhanced chemical vapor deposition (PECVD). Then the electrode pad 25 is etched by applying photolithography, and the electrode pad 25 facing the central portion 2234 of the stepped surface 2232 remains. Thereby, a light emitting diode chip 200 is obtained, as shown in FIG. 12.

It is understood that the above-described embodiment are intended to illustrate rather than limit the disclosure. Variations may be made to the embodiment without departing from the spirit of the disclosure. Accordingly, it is appropriate that the appended claims be construed broadly and in a manner consistent with the scope of the disclosure.

What is claimed is:

1. A light emitting diode chip comprising:
   a thermal conductive substrate;
   an epi-layer comprising a p-type semiconductor layer arranged on the substrate, an n-type semiconductor layer on the p-type semiconductor layer facing away from the substrate, and an active layer sandwiched between the p-type semiconductor layer and the n-type semiconductor layer, and the n-type semiconductor layer comprising a stepped surface at a side thereof facing away from the substrate, and the stepped surface comprising a central portion and a peripheral portion surrounding the central portion, the n-type semiconductor layer having a thickness decreasing along directions from a center thereof to opposite lateral peripheries thereof;
   a thin-type ohmic contacting film arranged on the stepped surface;
   a transparent conducting layer arranged on the ohmic contacting film facing away from the substrate; and
   an electrode pad arranged on the transparent conducting layer facing away from the substrate and being located corresponding to the central portion of the stepped surface.

2. The light emitting diode chip of claim 1, wherein the ohmic contacting film is annular with a hole defined therein for exposing the central portion of the stepped surface to the transparent conducting layer, and the transparent conducting layer comprises a portion filling in the hole and covering the central portion, such that the portion filling in the hole and covering the central portion and the n-type semiconductor layer cooperatively form non-ohmic contact.

3. The light emitting diode chip of claim 1, wherein the ohmic contacting film is uniformly distributed on the stepped surface, and the ohmic contacting film has a thickness in a ranged from about 0.1 μm to about 0.3 μm.

4. The light emitting diode chip of claim 1, wherein the ohmic contacting film is made of titanium.

5. The light emitting diode chip of claim 1, wherein the center of the n-type semiconductor layer has a thickness of about 3 μm.

6. The light emitting diode chip of claim 1, wherein a thinnest portion of the n-type semiconductor layer is greater or equal to 50% of a thickest portion of the n-type semiconductor layer.

7. The light emitting diode chip of claim 1, wherein the n-type semiconductor layer comprises a plurality of coaxial steps, and each step has a generally cylindrical shape.

8. The light emitting diode chip of claim 1, wherein the transparent conducting layer is made of one of an indium tin oxide and an indium zinc oxide.

9. The light emitting diode chip of claim 1, wherein the electrode pad is made of gold.

10. The light emitting diode chip of claim 1, further comprising a reflective layer sandwiched between the substrate and the p-type semiconductor layer.

11. The light emitting diode chip of claim 1, wherein the light emitting diode chip has a generally cylindrical shape.

12. A method for manufacturing a light emitting diode chip, comprising:
   forming an n-type semiconductor layer, an active layer, and a p-type semiconductor layer in sequence on a sapphire substrate;
   forming a thermal conducting substrate on the p-type semiconductor layer;
   removing the sapphire substrate to exposing a surface of the n-type semiconductor layer and machining the exposed surface into a stepped surface, such that the n-type semiconductor layer has a thickness decreasing along directions from a center thereof to opposite lateral peripheries thereof;
   forming a thin-type ohmic contacting film on the stepped surface;
   forming a transparent conducting layer on the ohmic contacting film;
   forming an electrode pad on the transparent conducting layer, the electrode pad being located corresponding to a central portion of the stepped surface.

13. The method of claim 12, wherein the exposed surface is machined into the stepped surface by applying a plurality of photolithography cycle.

14. The method of claim 12, further comprising:

defining a hole in the ohmic contacting film for exposing the central portion of the stepped surface to the transparent conducting layer before the transparent conducting layer is formed on the ohmic contacting film, such that a portion of the transparent conducting layer filling in the hole and covering the central portion of the stepped surface and the n-type semiconductor layer cooperatively form non-ohmic contact when the transparent conducting layer is formed on the ohmic contacting film.

15. The method of claim 14, wherein the hole is defined in the ohmic contacting film by applying a photolithography.

16. The method of claim 12, further comprising:

forming a reflective layer on the p-type semiconductor layer before forming the thermal conducting substrate on the p-type semiconductor layer, such that the reflective layer is coupled between the p-type semiconductor layer and the thermal conducting substrate when the thermal conducting substrate is formed on the p-type semiconductor layer.

* * * * *